(12) United States Patent
Lee et al.

(10) Patent No.: US 8,304,288 B2
(45) Date of Patent: Nov. 6, 2012

(54) METHODS OF PACKAGING SEMICONDUCTOR DEVICES INCLUDING BRIDGE PATTERNS

(75) Inventors: Hyuek-Jae Lee, Suwon-si (KR); Ji-Sun Hong, Asan-si (KR); Tae-Je Cho, Yongin-si (KR); Jong-Yun Myung, Seoul (KR); Young-Bok Kim, Asan-si (KR); Hyung-Sun Jang, Anyang-si (KR); Eun-Mi Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/155,647

(22) Filed: Jun. 8, 2011

(65) Prior Publication Data

US 2011/0306167 A1    Dec. 15, 2011

(30) Foreign Application Priority Data

Jun. 9, 2010 (KR) ........................ 10-2010-0054428

(51) Int. Cl.
*H01L 21/00* (2006.01)
(52) U.S. Cl. ...................................................... 438/113
(58) Field of Classification Search .................. 438/113, 438/114, 462; 257/E21.599
See application file for complete search history.

(56) References Cited

U.S. PATENT DOCUMENTS

| | | | |
|---|---|---|---|
| 2009/0014826 A1 | 1/2009 | Chien et al. | |
| 2009/0246938 A1* | 10/2009 | Kim | 438/462 |
| 2010/0117181 A1* | 5/2010 | Kim et al. | 257/432 |
| 2010/0273312 A1* | 10/2010 | Noda | 438/462 |

FOREIGN PATENT DOCUMENTS

| | | |
|---|---|---|
| JP | 2005-235859 | 9/2005 |
| JP | 2008-270520 | 11/2008 |

* cited by examiner

*Primary Examiner* — William D Coleman
*Assistant Examiner* — Christine Enad
(74) *Attorney, Agent, or Firm* — Myers Bigel Sibley & Sajovec, P.A.

(57) ABSTRACT

A method of packaging a semiconductor device may include providing a semiconductor substrate including first and second spaced apart semiconductor chip areas, and adhering a cover on the first and second spaced apart semiconductor chip areas of the semiconductor substrate. A scribe line may be formed through the semiconductor substrate between the first and second semiconductor chip areas with a semiconductor bridge pattern remaining connected between the first and second spaced apart semiconductor chip areas after forming the scribe line. The cover and the semiconductor bridge pattern may then be cut after forming the scribe line.

20 Claims, 9 Drawing Sheets

METHODS OF PACKAGING SEMICONDUCTOR DEVICES INCLUDING BRIDGE PATTERNS

CROSS-REFERENCE TO RELATED APPLICATION

This application claims priority from Korean Patent Application No. 10-2010-0054428 filed on Jun. 9, 2010 in the Korean Intellectual Property Office, and all the benefits accruing therefrom under 35 U.S.C. 119. The disclosure of the above referenced application is hereby incorporated herein in its entirety by reference.

BACKGROUND

1. Technical Field

The present inventive concepts relate to the field of semiconductor packaging.

2. Description of Related Art

Image sensors (such as charge coupled device (CCD) sensors, complementary metal oxide semiconductor (CMOS) image sensor devices, etc.) are employed in various electronic products, such as mobile phones, digital cameras, optical mouses, surveillance cameras, biometric identification devices, etc.

Due to the trends towards miniaturized and multi-functional electronic products, demand continues for semiconductor packages incorporating image sensors providing reduced size, increased integration, reduced power consumption, increased functionality, increased signal processing speeds, increased reliability, reduced costs, and/or increased image definition and/or quality. To meet these demands, numerous studies are under way. In addition, methods of fabricating CCD sensors or CMOS sensors in a more cost-efficient manner are being researched.

SUMMARY

According to some embodiments, a method of packaging a semiconductor device may include providing a semiconductor substrate including first and second spaced apart semiconductor chip areas and adhering a cover on the first and second semiconductor chip areas of the semiconductor substrate. Via holes may be formed through the semiconductor substrate in the first and second semiconductor chip areas. Moreover, a scribe line may be formed through the semiconductor substrate between the first and second semiconductor chip areas and a semiconductor bridge pattern in the scribe line may also be formed. The cover may be cut along the scribe line.

According to some other embodiments, a method of packaging a semiconductor device may include providing a semiconductor substrate having first and second spaced apart semiconductor chip areas. A cover may be adhered on the first and second semiconductor chip areas of the semiconductor substrate, and via holes may be formed through the semiconductor substrate in the first and second semiconductor chip areas. A scribe line may be formed between the first and second semiconductor chip areas while maintaining an anti-crack portion of the semiconductor substrate in the scribe line. Moreover, the cover may be cut along the scribe line.

According to yet other embodiments, a method of packaging a semiconductor device may include providing a semiconductor substrate including first and second spaced apart semiconductor chip areas. A cover may be adhered on the first and second spaced apart semiconductor chip areas of the semiconductor substrate. A scribe line may be formed through the semiconductor substrate between the first and second semiconductor chip areas with a semiconductor bridge pattern remaining connected between the first and second spaced apart semiconductor chip areas after forming the scribe line. Moreover, the cover and the semiconductor bridge pattern may be cut. For example, the cover and the semiconductor bridge pattern may be cut after forming the scribe line.

According to some embodiments, a method of fabricating a semiconductor package may reduce generation of cracking or chipping defects in the course of fabricating the semiconductor package.

According to some embodiments, a method of fabricating a semiconductor package may include providing a semiconductor substrate including a first surface and a second surface and having a first semiconductor chip area and a second semiconductor chip area adjacent to the first semiconductor chip area. A cover may be adhered on the semiconductor substrate so as to face the first surface of the semiconductor substrate. Via holes may be formed in the first and second semiconductor chip areas. A scribe line may be formed in a spacing area between the first and second semiconductor chip areas, a bridge pattern may be located in the scribe line, and the cover may be cut along the scribe line.

According to other embodiments, a method of fabricating a semiconductor package may include providing a semiconductor substrate including a first surface and a second surface and having a first semiconductor chip area and a second semiconductor chip area adjacent to the first semiconductor chip area. A cover may be adhered on the semiconductor substrate so as to face the first surface of the semiconductor substrate. A first mask pattern may be formed on the second surface. The first mask pattern may include a first thickness area and a second thickness area greater than the first thickness area. Via holes may be formed in the first and second semiconductor chip areas. A scribe line may be formed in a spacing area between the first and second semiconductor chip areas, a bridge pattern may be located in the scribe line and may connect the first and second semiconductor chip areas. The cover may be cut along the scribe line.

According to still other embodiments, a method of fabricating a semiconductor package may include providing a semiconductor substrate including a first surface and a second surface and having a first semiconductor chip area and a second semiconductor chip area adjacent to the first semiconductor chip area. A cover may be adhered on the semiconductor substrate so as to face the first surface of the semiconductor substrate. Via holes may be formed in the first and second semiconductor chip areas. A scribe line may be formed in a spacing area between the first and second semiconductor chip areas and an anti-crack portion may remain in the scribe line. The cover may be cut along the scribe line.

BRIEF DESCRIPTION OF THE DRAWINGS

The above and other features and advantages of the present inventive concepts will become more apparent by describing in detail embodiments thereof with reference to the attached drawings in which.

DETAILED DESCRIPTION

Figure 1:
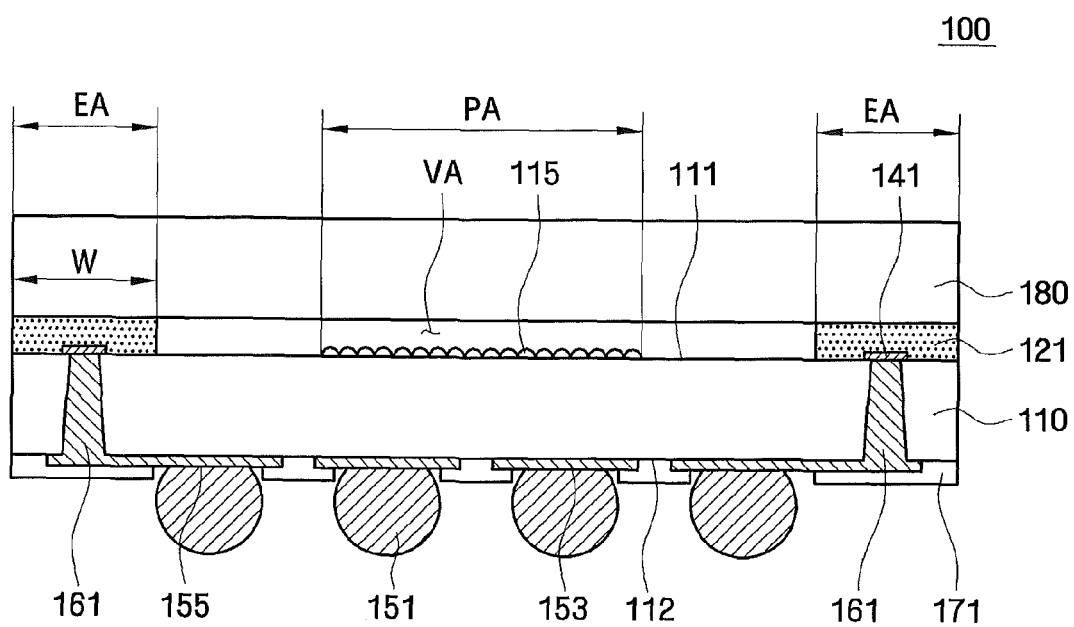
FIG. 1 is a cross-sectional view of a semiconductor package according to some embodiments of the present general inventive concepts.

Advantages and features of the present inventive concepts and methods of accomplishing the same may be understood more readily by reference to the following detailed description of embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the inventive concepts to those skilled in the art, and the present inventive concepts will only be defined by the appended claims. In the drawings, the thicknesses of layers and regions are exaggerated for clarity.

Throughout the drawings and written description, like reference numerals will be used to refer to like or similar elements. As used herein, the term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

Example embodiments of the present general inventive concept are described herein with reference to cross-section illustrations that are schematic illustrations of idealized embodiments (and intermediate structures) of the inventive concepts. As such, variations from the shapes of the illustrations as a result, for example, of manufacturing techniques and/or tolerances, are to be expected. Thus, embodiments of the present general inventive concepts should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present general inventive concepts.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a method of fabricating the semiconductor package of FIG. 1, according to some embodiments of the present general inventive concepts will be described with reference to FIGS. 1 through 16.

First, a semiconductor package according to an embodiment of the present general inventive concepts is described with reference to FIG. 1.

Referring to FIG. 1, the semiconductor package 100 according to some embodiments of the present general inventive concepts includes a semiconductor chip 110, an adhesive pattern 121, external connection terminals 151, and a transparent cover 180.

The semiconductor chip 110 has a first surface 111, a second surface 112, and a pixel area PA. In addition, the semiconductor chip 110 includes an edge area EA surrounding the pixel area PA. Here; the pixel area PA may be located at the center of the semiconductor chip 110, but embodiments of the present inventive concepts are not limited thereto. The pixel area PA may include an array of microlenses 115. Here, the array of microlenses 115 may be disposed on the first surface 111 of the semiconductor chip 110.

The adhesive pattern 121 is disposed on the first surface 111 of the semiconductor chip 110. Here, the adhesive pattern 121 may be disposed on the first surface 111 so as to surround the pixel area PA. To this end, the adhesive pattern 121 may be disposed on the edge area EA of the semiconductor chip 110. That is to say, the adhesive pattern 121 is formed along the edge area EA to define a shape of a closed loop or frame surrounding the pixel area PA.

The adhesive pattern 121 allows the transparent cover 180 to be fixedly bonded to the first surface 111 of the semiconductor chip 110. To this end, as shown in FIG. 1, the adhesive pattern 121 may be interposed between the semiconductor chip 110 and the transparent cover 180. Here, a void/cavity area VA may be formed between the transparent cover 180 and the pixel area PA due to a thickness of the adhesive pattern 121. Meanwhile, when the adhesive pattern 121 is shaped as a closed loop or frame, the void/cavity area VA may be shielded from the outside. Accordingly, the pixel area PA positioned within the void/cavity area VA can be protected from an external environment/atmosphere (e.g., atmospheric air). For example, when the array of microlenses 115 disposed in the pixel area PA is exposed to external air (including moisture), an amount of light received by and/or a useful life of each of various devices provided in the pixel area PA may be reduced. By sealing the pixel area PA within the void/cavity area, light reception and/or useful lifetime maybe improved. Meanwhile, a width W of the adhesive pattern 121 may be large enough for the transparent cover 180 to be securely fixed to the first surface 111 of the semiconductor chip 110. As shown in FIG. 1, void/cavity area VA is defined by the spacing between cover 180 and chip 110, and void/cavity area VA may be free of solid layers or other solid mass. Void/cavity area VA may define a vacuum, or a fluid (e.g., a gas) may be provided in the void/cavity area VA.

The adhesive pattern 121 may include, for example, a photosensitive adhesive polymer, a thermosetting polymer, and/or an epoxy-based compound. In some embodiments, the adhesive pattern 121 may include, for example, benzocyclobutene.

Meanwhile, the conductive pad 141 may be disposed in the edge area EA. Here, the conductive pad 141 may be located on the first surface 111 of the semiconductor chip 110. In addition, the adhesive pattern 121 may be located to overlap the conductive pad 141. Here, the conductive pad 141 may be integrally formed with, for example, a via plug (not shown) connected to wires (not shown) disposed in the edge area EA.

The semiconductor chip 110 may include a through-hole via 161 connected to the conductive pad 141. The through-hole via 161 may be formed for the purpose of reducing the overall size of a semiconductor package while increasing a signal transfer speed.

The semiconductor package 100 may include a redistribution pad(s) 153 disposed on the second surface 112 of the semiconductor chip 110. Here, a redistribution pad 153 adjacent to the edge area EA of the semiconductor chip 110 may electrically contact a respective through-hole via 161. That is to say, one side of a through-hole via 161 may electrically contact a conductive pad 141, and the other side thereof may electrically contact a redistribution pad 153.

The semiconductor package 100 may include an external connection terminal 151 disposed on the second surface 112 of the semiconductor chip 110. The external connection terminal 151 may have a shape of, for example, a solder ball, but aspects of the present inventive concepts are not limited thereto. That is to say, the external connection terminal 151 may have various shapes according to the shape of a connection terminal of a mother board on which the semiconductor package 100 is to be mounted. The external connection terminal 151 may be disposed on the redistribution pad 153. Here, the external connection terminal 151 may include a junction area 155 electrically contacting the redistribution pad 153. Accordingly, the external connection terminal 151 may transfer a signal delivered through the redistribution pad 153 to the outside of the semiconductor package 100. The junction area 155 is formed on the second surface 112 of the semiconductor chip 110.

Meanwhile, an insulation film 171 may be disposed on portions of the redistribution pad 153. That is to say, the insulation film 171 may be disposed on portions of the redistribution pad 153 where the redistribution pad 153 and the external connection terminal 151 are not electrically in contact with each other. The insulation film 171 may reduce electrical disconnection of the redistribution pad 153 from the outside of the semiconductor chip 110.

Figure 2:
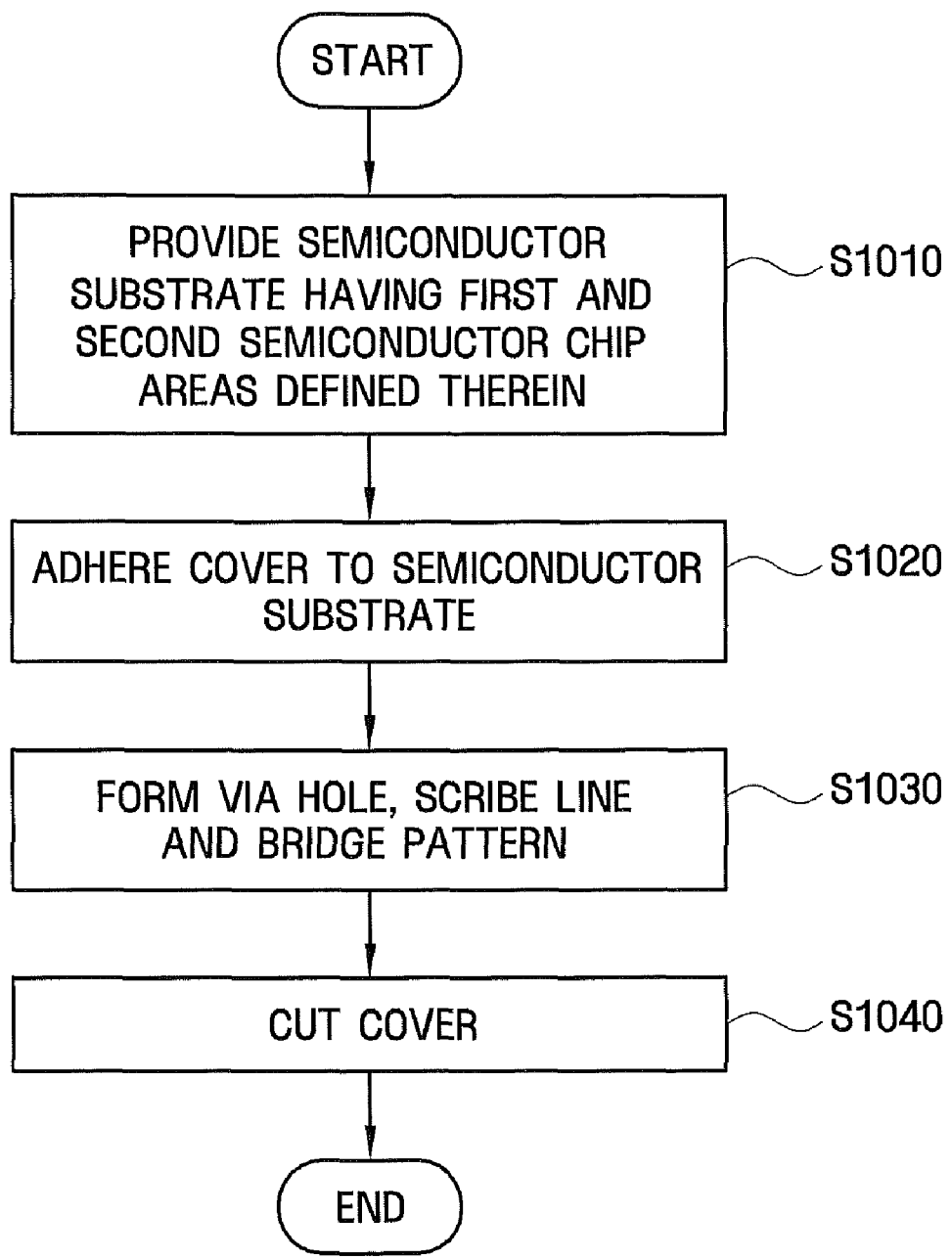
FIG. 2 is a flow chart illustrating operations of fabricating the semiconductor package of FIG. 1, according to some embodiments of the present general inventive concepts.
Figure 3:
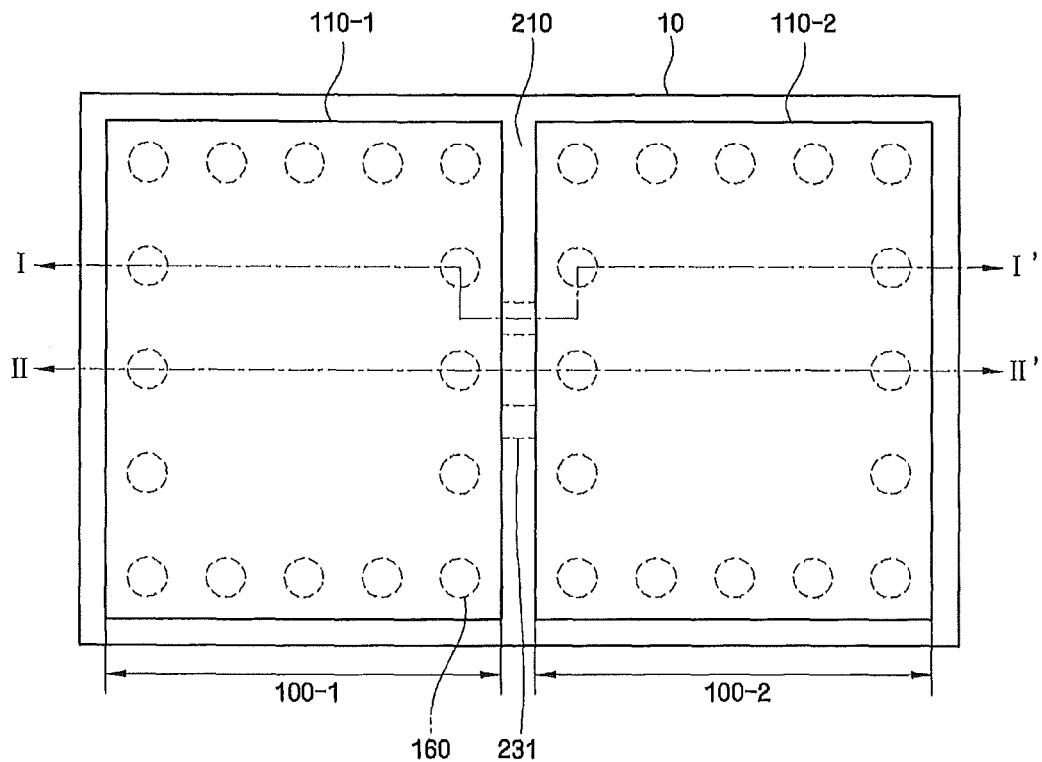
FIG. 3 is a first plan view of a semiconductor substrate according to some embodiments of the present general inventive concepts.
Figure 4:
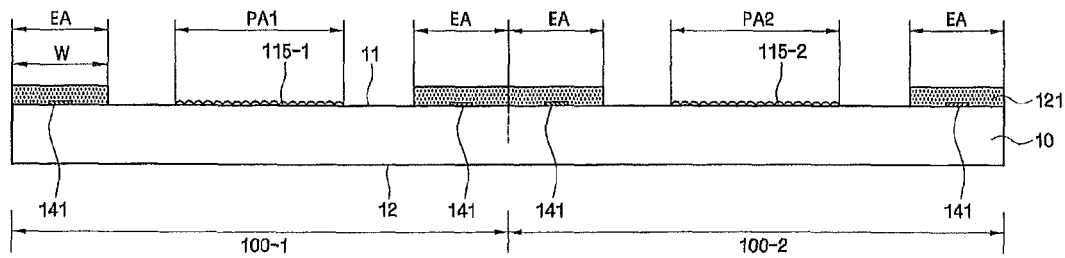
FIGS. 4 and 5 are cross-sectional views taken along the line I-I' or II-II' of FIG. 3.
Figure 5:
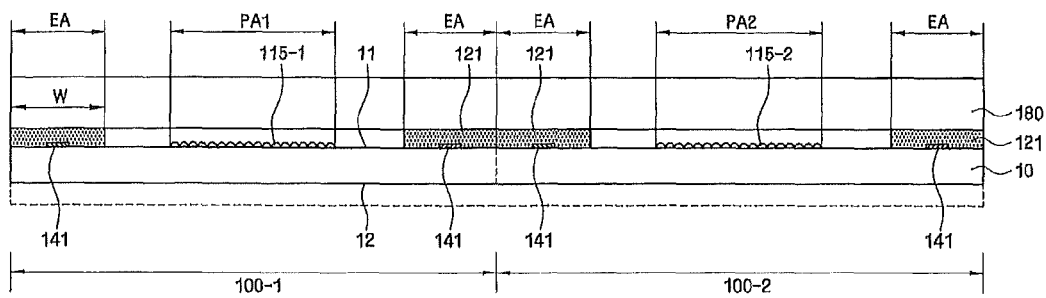
Figure 6:
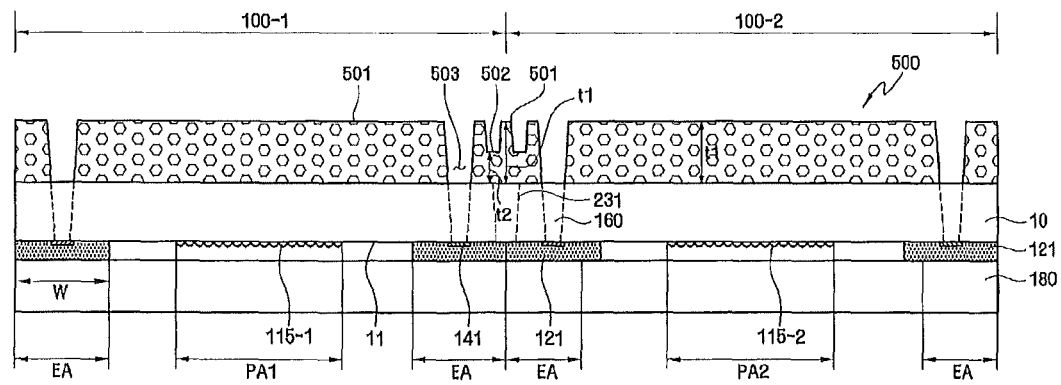
FIG. 6 is a cross-sectional view taken along the line I-I' of FIG. 3.
Figure 7:
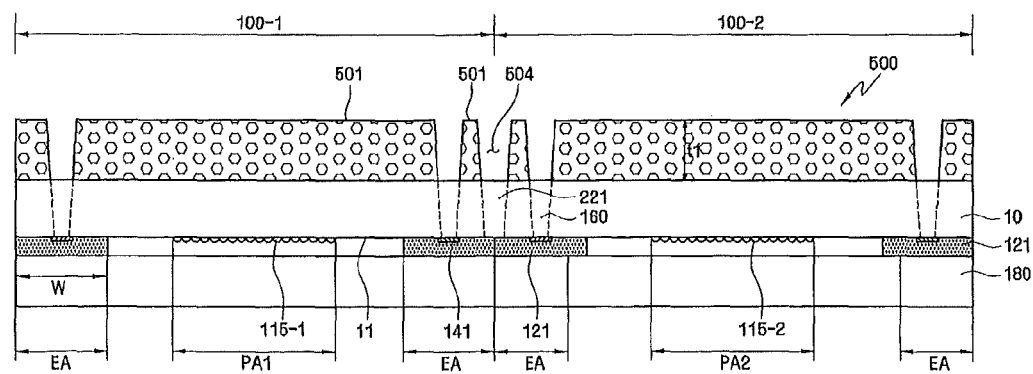
FIG. 7 is a cross-sectional view taken along the line II-II' of FIG. 3.
Figure 8:
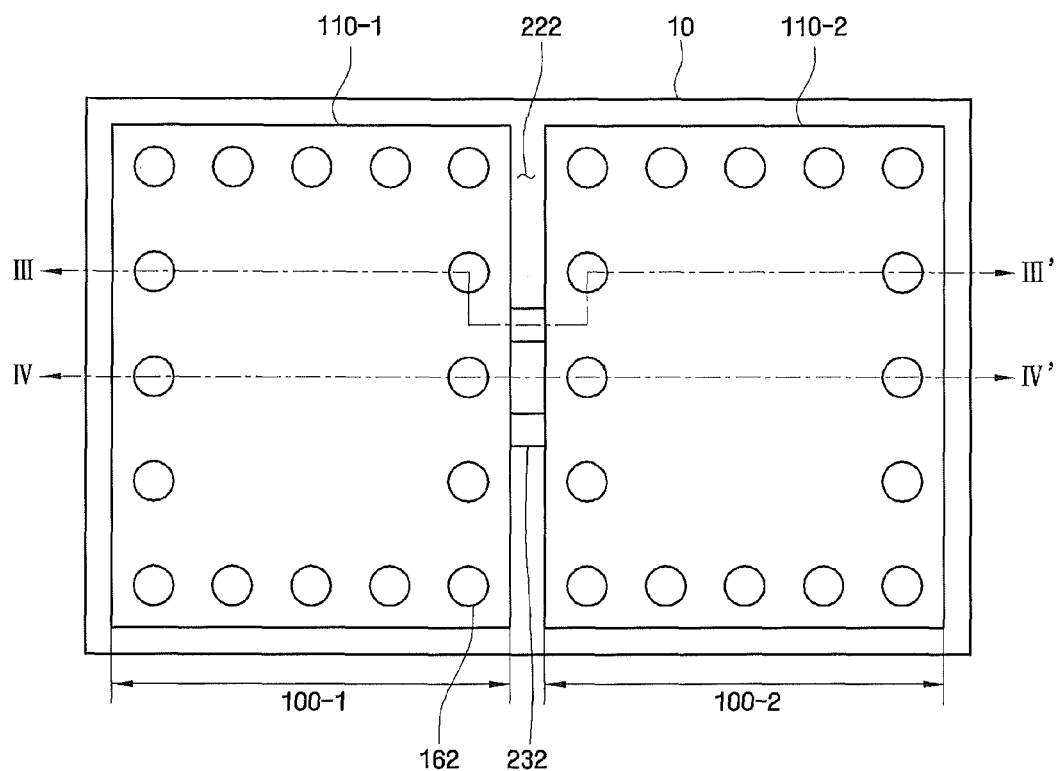
FIG. 8 is a second plan view of a semiconductor substrate according to some embodiments of the present general inventive concepts.
Figure 9:
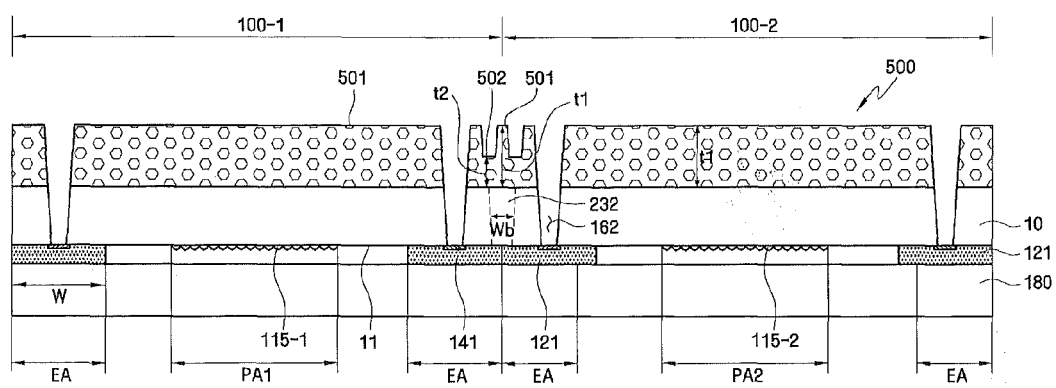
FIGS. 9 and 11 are cross-sectional views taken along the line III-III' of FIG. 8.
Figure 10:
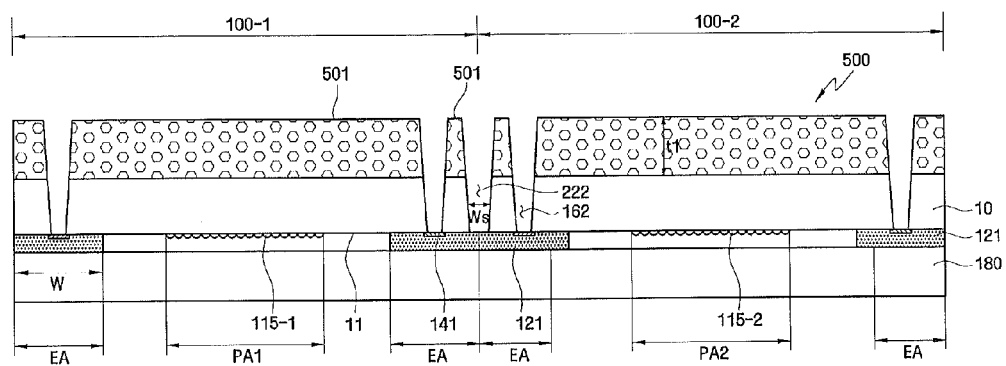
FIG. 10 is a cross-sectional view taken along the line IV-IV' of FIG. 8.
Figure 11:
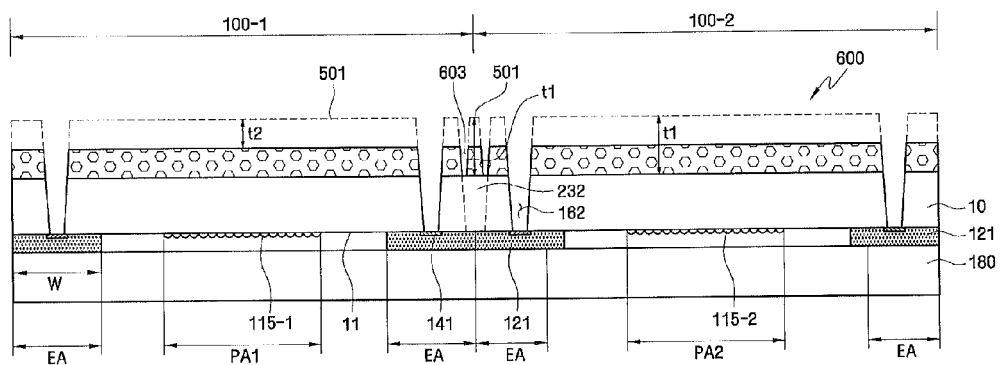
Figure 12:
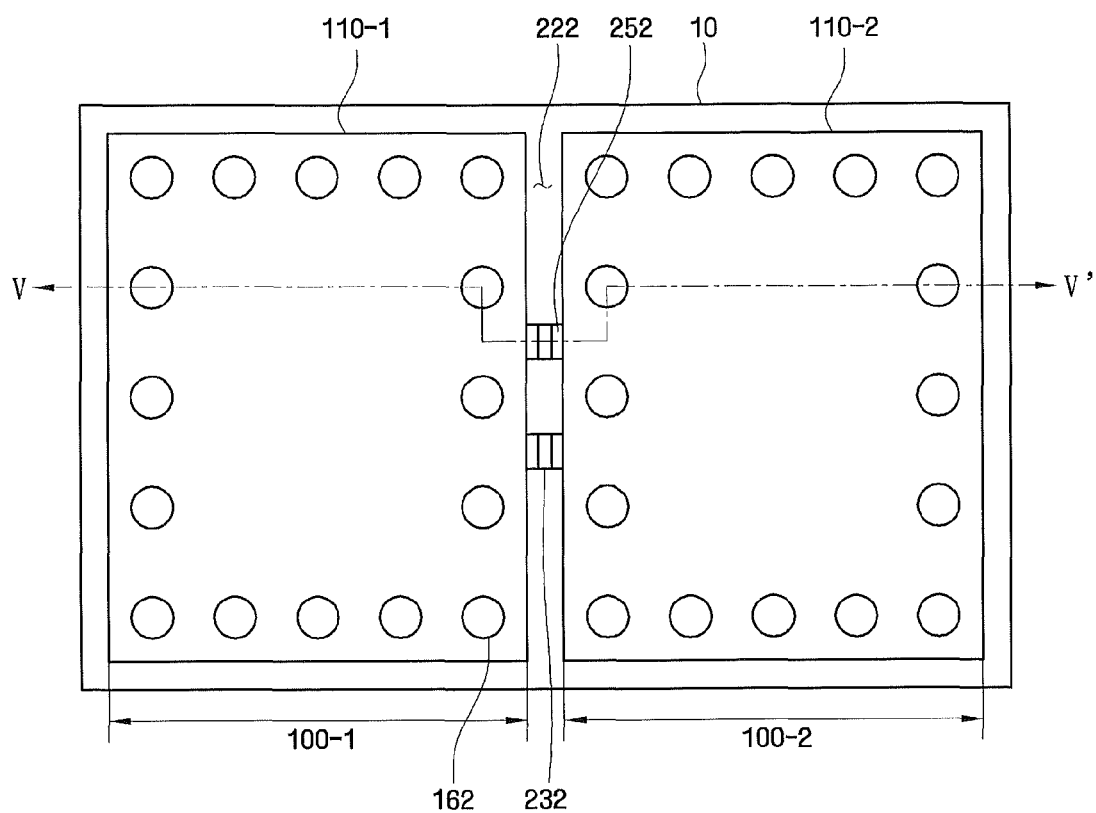
FIG. 12 is a third plan view of a semiconductor substrate according to some embodiments of the present inventive concepts.
Figure 13:
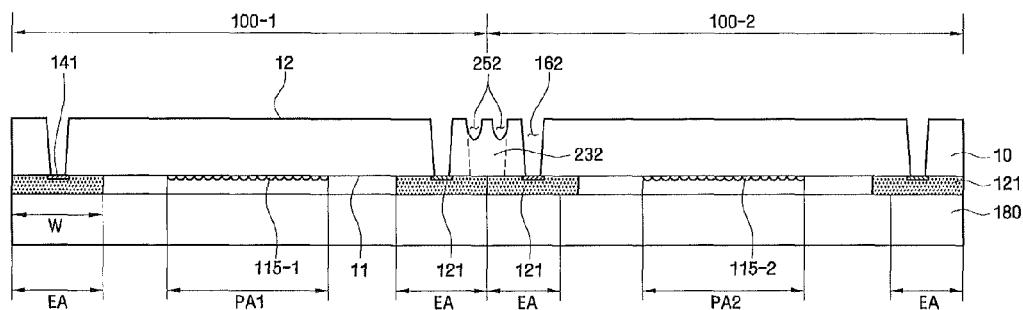
FIG. 13 is a cross-sectional view taken along the line IV-IV' of FIG. 12.

Next, a method of fabricating the semiconductor package of FIG. 1, according to some embodiments of the present general inventive concepts will be described with reference to FIGS. 2 through 16. FIG. 2 is a flow chart illustrating operations of fabricating the semiconductor package of FIG. 1; according to some embodiments of the present general inventive concepts, FIG. 3 is a first plan view of a semiconductor substrate, FIGS. 4 and 5 are cross-sectional views taken along the line I-I' or II-II' of FIG. 3, FIG. 6 is a cross-sectional view taken along the line I-I' of FIG. 3, FIG. 7 is a cross-sectional view taken along the line II-II' of FIG. 3, FIG. 8 is a second plan view of a semiconductor substrate, FIGS. 9 and 11 are cross-sectional views taken along the line III-III' of FIG. 8, FIG. 10 is a cross-sectional view taken along the line IV-IV' of FIG. 8, FIG. 12 is a third plan view of a semiconductor substrate, FIG. 13 is a cross-sectional view taken along the line IV-IV' of FIG. 12, and FIGS. 14 through 16 are cross-sectional views illustrating process operations of fabricating the semiconductor package according to some embodiments of the present general inventive concepts. For convenience of description when repeated, the same functional members as those shown in FIG. 1 are referred to using the same reference numerals, and the description thereof may be omitted.

Referring to FIGS. 2 and 3, in step S1010, a semiconductor substrate 10 having a first semiconductor chip area 110-1 and a second semiconductor chip area 110-2 defined therein is provided. The first semiconductor chip area 110-1 may include first and second surfaces 11 and 12 and a first pixel area PA1, and the second semiconductor chip area 110-2 may include a second pixel area PA1. Here, the semiconductor substrate 10 may include, for example, silicon (Si).

Here, the first and second semiconductor chip areas 110-1 and 110-2 are formed of semiconductor chips (see '110' of FIG. 1) included in first and second semiconductor packages 100 to be formed later. Meanwhile, potential via hole areas 160 to be formed as a via hole in a later step may be defined in the semiconductor substrate 10. Here, the potential via hole area as 160 may be defined in a predetermined location in each of the first and second semiconductor chip areas 110-1 and 110-2.

Meanwhile, a spacing area 210 may be defined between the first and second semiconductor chip areas 110-1 and 110-2. A scribe line (see '222' of FIG. 10) to be formed in a later process may be formed in the spacing area 210. A potential bridge pattern area 231 where a bridge pattern (see '232' of FIG. 8) is formed in a later process may be defined in the semiconductor substrate 10. Here, the potential bridge pattern area 231 may be defined in a predetermined location of the spacing area 210.

Referring to FIG. 4, an adhesive pattern 121 is formed on the semiconductor substrate 10. The adhesive pattern 121 may be formed on the first surface 11 of the semiconductor substrate 10. Here, the first surface 11 of the semiconductor substrate 10 is the same as the first surface 111 of the semiconductor chip 110 provided in the semiconductor package 100 (see FIG. 1).

The adhesive pattern 121 may be formed in an edge area EA of each of the first and second semiconductor chip areas 110-1 and 110-2. In addition, the adhesive pattern 121 may be formed in a spacing area 210 between the first and second semiconductor chip areas 110-1 and 110-2. Here, the adhesive pattern 121 may be formed to surround first and second pixel areas PA1 and PA2 of the first and second semiconductor chip areas 110-1 and 110-2, respectively.

To form the adhesive pattern 121, a photosensitive adhesive polymer film, for example, is coated on the entire surface of the semiconductor substrate 10 and soft-baked at a low temperature in a range of approximately 50° C. to approximately 70° C. Then, the photosensitive adhesive polymer film is patterned through exposure and development, thereby forming the adhesive pattern 121. In alternatives to the above-described method, the adhesive pattern 121 may also be formed by a dispenser method, a screen printing method, and/or an ink jetting method.

Next, referring to FIG. 5, a transparent cover 180 is placed on the semiconductor substrate 10 having the adhesive pattern 121. Subsequently, the transparent cover 180 is compressed by applying heat thereto to adhere the transparent cover to the semiconductor substrate 10 in step S1020. The adhesion may be performed at a temperature in a range of approximately 150° C. to approximately 210° C. Accordingly, a sealed void/cavity area VA may be formed between the transparent cover 180 and the semiconductor substrate 10. Subsequently, after the transparent cover 180 is adhered to the semiconductor substrate 10, a thinning process may be performed to reduce a thickness of the semiconductor substrate 10.

Referring to FIGS. 6 and 7, a first mask pattern 500 having a first thickness area 501 and a second thickness area 502 is formed on the second surface 12 of the semiconductor substrate 10. Here, the second surface 12 of the semiconductor substrate 10 is the same as the second surface 112 of the semiconductor chip 110 of the semiconductor package 100 (see FIG. 1).

Here, a thickness t1 of the first thickness area 501 may be greater than a thickness t2 of the second thickness area 502. In addition, the first mask pattern 500 includes a first opening 503 exposing portions of the first and second semiconductor chip areas 110-1 and 110-2 and a second opening 504 exposing a portion of the spacing area 210. Here, the first opening 503 corresponds the potential via hole area 160 of each of the first and second semiconductor chip areas 110-1 and 110-2. In addition, the second opening 504 corresponds the potential scribe area 221.

Meanwhile, the second surface 12 of the semiconductor substrate 10 is covered by the first thickness area 501 of the first mask pattern 500 having the first thickness t1, excluding the potential via hole area 160, the potential scribe area 221 and the potential bridge pattern area 231. The potential bridge pattern area 231 is covered by the first thickness area 501 having the first thickness t1 and the second thickness area 502 having the second thickness t2. Here, the second thickness area 502 may be formed to correspond to a potential area of anti-chipping pattern (252 of FIG. 15).

To form the first mask pattern 500, a photoresist film (not shown) is first formed on the second surface 12 of the semiconductor substrate 10. Here, the photoresist film may be of a positive type or a negative type. For convenience of explanation, it is assumed that the photoresist film is a negative-type photoresist film.

The photoresist film is exposed to light using an exposure mask (not shown). Here, the exposing may not be applied to areas of the photoresist film where the first and second openings 503 and 504 are to be formed. In addition, an area of the photoresist film where the second thickness area 502 is to be formed is exposed with a greater amount of light exposed than a portion of the photoresist film where the first thickness area 501 is to be formed. Here, the photoresist film area to be formed as the second thickness area 502 may be exposed using, for example, a slit mask (not shown) or a half-tone mask (not shown).

After the exposing process, the exposed photoresist film is developed using a developer solution, thereby forming the first mask pattern 500.

Referring to FIGS. 8 through 10, the semiconductor substrate 10 is etched using the first mask pattern 500. Here, the etched area of the semiconductor substrate 10 corresponds to the first and second openings 503 and 504 of the first mask pattern 500. In step S1030, the via holes 162 are formed in the first and second semiconductor chip areas 110-1 and 110-2, and scribe line 222 and the bridge pattern 232 are formed in the spacing area 210 by etching the semiconductor substrate 10.

The scribe line 222 is used when two or more semiconductor packages formed from one single semiconductor substrate (or wafer) 10 are partitioned in a subsequent process. For example, the scribe line 222 is used as a cutting line of the transparent cover 180 facing the semiconductor substrate 10. To this end, a blade that cuts the transparent cover 180 may pass over the scribe line 222.

The bridge pattern 232 connecting the first semiconductor chip area 110-1 to the second semiconductor chip area 110-2 may be disposed within the scribe line 222. One or more bridge patterns 232 may be formed in the scribe line 222. However, for convenience of explanation, FIG. 8 shows that two bridge patterns 232 are disposed in the scribe line 222, but embodiments of inventive concepts are not limited thereto.

The bridge pattern 232 may prevent and/or reduce generation of cracks in an inter-metal dielectric (IMD) (not shown) formed on the semiconductor substrate 10 when forming the scribe line 222. In other words, the bridge pattern(s) 232 may function as an anti-crack portion to reduce generation of cracks in the IMD formed on the semiconductor substrate 10. Here, a width Wb of the bridge pattern 232 may be substantially the same as a width Ws of the scribe line 222.

In the manufacture of a semiconductor package, a semiconductor substrate made of, for example, silicon, and a transparent cover facing the semiconductor substrate may be cut, thereby forming a plurality of semiconductor packages in a batch. Here, when the semiconductor substrate and the transparent cover are made of different materials, they may be cut using different blades. Alternatively, the semiconductor substrate and the transparent cover may be cut at different cutting speeds. To address these potential disadvantages, when forming via holes in the semiconductor substrate, spacing areas between each of a plurality of semiconductor chip areas defined in the semiconductor substrate may be removed in advance. That is to say, semiconductor chips may be partitioned for each of the semiconductor chip areas by forming the scribe line 222 in the semiconductor substrate. In this case, the semiconductor package fabrication may be completed by cutting the cover.

However, when forming the scribe line 222 in the semiconductor substrate 10, the IMD formed on the semiconductor substrate 10 may remain connected between each of the plurality of semiconductor chip areas. In this case, spaces between the partitioned plurality of semiconductor chips may be supported by the IMD. Accordingly, cracks may be generated in the IMD in continuous process steps due to cavities existing in the semiconductor chips, which may cause short-circuiting between metal wires formed in the semiconductor chips, thereby lowering the reliability of a semiconductor device and lowering the yield of semiconductor packages.

In some embodiments of the present inventive concepts, at least one bridge pattern 232 connecting the first semiconductor chip area 110-1 and the second semiconductor chip area 110-2 adjacent to the first semiconductor chip area 110-1 may be formed in the scribe line 222, thereby allowing the bridge pattern 232 to support the first semiconductor chip area 110-1 and the second semiconductor chip area 110-2 adjacent to the first semiconductor chip area 110-1. Accordingly, it may be possible to reduce and/or prevent generation of cracks in the IMD.

Referring to FIG. 11, the first mask pattern 500 may be etched back to remove the second thickness area 502 of the first mask pattern 500. That is to say, the first mask pattern 500 is etched back as much as the thickness t2 of the second thickness area 502. In such a manner, a second mask pattern 600 is formed, and the second mask pattern 600 may include a third opening(s) 603 exposing a portion of the bridge pattern 232. The second mask pattern 600 covers the second surface 12 of the semiconductor substrate 10, excluding the via hole (s) 162, the scribe line 222 and a portion of the bridge pattern (s) 232.

Referring to FIGS. 12 and 13, a portion(s) of the bridge pattern(s) 232 is etched using the second mask pattern 600. Here, the bridge pattern(s) 232 is etched to form recesses from the second surface 12 toward the first surface 11. In addition, the bridge pattern(s) 232 is etched so that the recesses extend in parallel with the scribe line 222. In such a manner, an anti-chipping pattern(s) 252 is formed in the bridge pattern(s) 232. That is to say, the anti-chipping pattern(s) 252 is recessed from the second surface 12 toward the first surface 11 of the semiconductor substrate 10. In addition, the anti-chipping pattern(s) 252 is configured such that it extends in parallel with the scribe line 222.

Meanwhile, the bridge pattern(s) 232 is cut at the same time when the transparent cover 180 is cut in a subsequent process. Here, chipping defects may occur at the first and second semiconductor chip areas 110-1 and 110-2, thereby creating some unevenly cut chips of the semiconductor chips. Accordingly, to reduce and/or avoid chipping defects, which may occur when cutting the bridge pattern(s) 232, the portion of the bridge pattern(s) 232 may be etched in advance before it is cut. In such a manner, it is possible to reduce and/or avoid the chipping defects, which may be generated when the bridge pattern(s) 232 is cut. That is to say, the anti-chipping pattern(s) 252 may function as a chipping reduction/prevention portion(s). The anti-chipping pattern(s) 252 may be formed to contact the first and second semiconductor chip areas 110-1 and 110-2.

Figure 14:
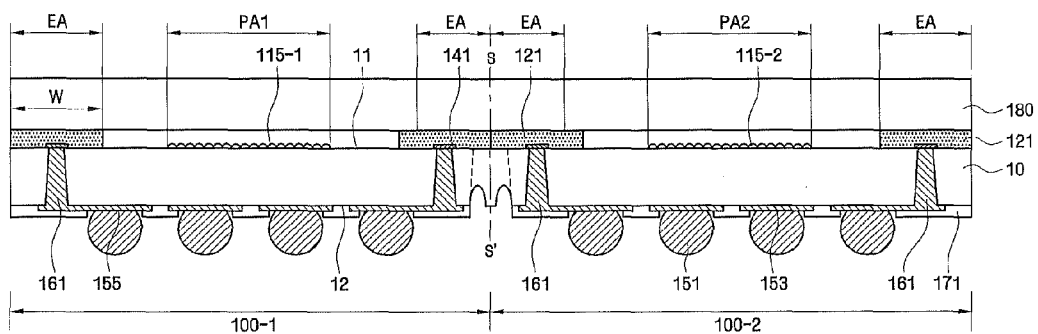
FIGS. 14 through 16 are cross-sectional views illustrating process steps of fabricating semiconductor packages according to some embodiments of the present general inventive concepts.
Figure 15:
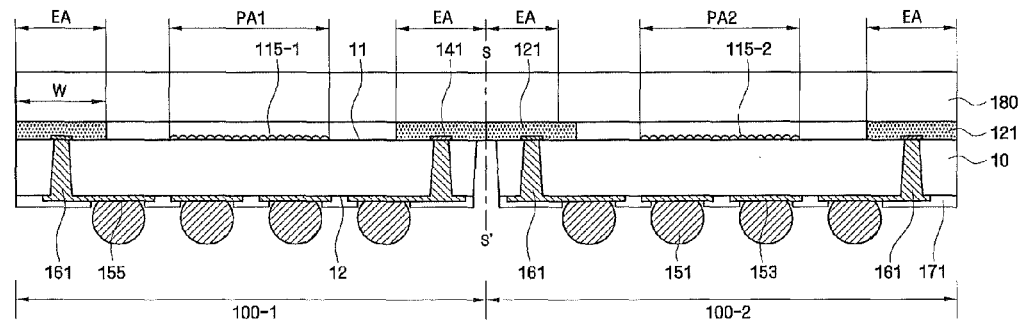

Referring to FIGS. 14 and 15, a conductive film is deposited and patterned, thereby forming a through-hole via 161 electrically contacting the conductive pad 141 formed on the semiconductor substrate 10 while covering sidewalls of the via hole 162.

Thereafter, a redistribution pad(s) 153 is formed with the redistribution pad(s) 153 being electrically connected to the through-hole via(s) 161 and disposed on the second surface 12 of the semiconductor substrate 10. Next, an insulation film 171 is formed, the insulation film 171 covering the through-hole via(s) 161 and a portion of the redistribution pad(s) 153. Then, an external connection terminal(s) 151 is formed on the exposed redistribution pad(s) 153 without being covered by the insulation film 171. The external connection terminal(s) 151 may have a shape of, for example, a solder ball. Meanwhile, the external connection terminal(s) 151 may include a junction area 155 contacting the respective redistribution pad 153. The junction area 155 may be formed on the second surface 12 of the semiconductor substrate 10.

Figure 16:
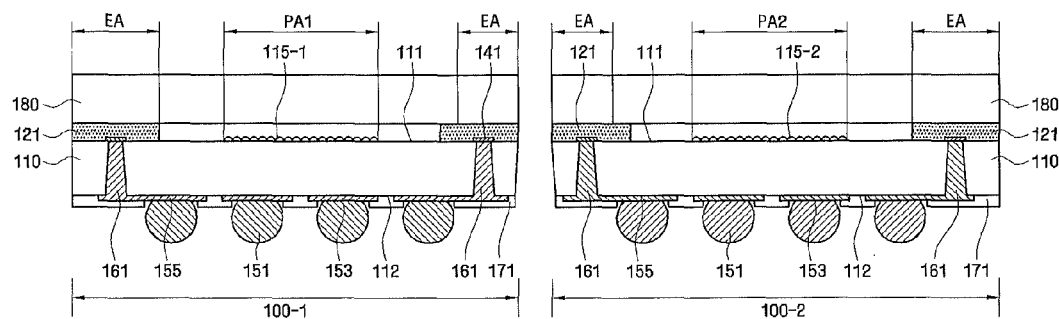

Referring to FIG. 16, in step S1040, the transparent substrate 180 and the bridge pattern 232 of the semiconductor substrate 10 are cut along the line S-S' provide separation for each unit semiconductor package 100, which is referred to as a singulation process. The singulation process may be performed using a diamond cutting blade, for example. Here, the cutting blade may move along the scribe line 222.

As described above, according to some embodiment of the present inventive concepts, the semiconductor package may be fabricated with reduced cracks and/or without cracks in the IMD formed on the semiconductor substrate 10 or with reduced chipping and/or without chipping defects of semiconductor chips. Embodiment(s) of the present inventive concepts may provide for a reliable semiconductor device. In addition, according to embodiments of the present inventive concepts, the cost effectiveness in the course of fabricating semiconductor packages may be improved. Further, the yield of the semiconductor packages can be enhanced and the time of manufacturing of the semiconductor packages can be shortened.

While the present inventive concepts have been particularly shown and described with reference to examples of embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive; reference being made to the appended claims rather than the foregoing description to indicate the scope of the inventive concepts.

The invention claimed is:

1. A method of packaging a semiconductor device, the method comprising:
providing a semiconductor substrate including first and second spaced apart semiconductor chip areas;
adhering a cover on the first and second semiconductor chip areas of the semiconductor substrate;
forming via holes through the semiconductor substrate in the first and second semiconductor chip areas;
forming a scribe line through the semiconductor substrate between the first and second semiconductor chip areas and forming a semiconductor bridge pattern in the scribe line while maintaining the cover across the first and second semiconductor chip areas and across the scribe line therebetween, wherein the scribe line comprises an opening through the substrate; and
after forming the scribe line and the semiconductor bridge pattern, cutting the cover along the scribe line.

2. The method of claim 1, wherein the semiconductor bridge pattern is connected between the first and second semiconductor chip areas.

3. The method of claim 1, further comprising:
forming an anti-chipping pattern in the semiconductor bridge pattern.

4. The method of claim 3, wherein the anti-chipping pattern defines a recess in the semiconductor bridge pattern opposite the cover so that the semiconductor bridge pattern is between the recess and the cover.

5. The method of claim 4, wherein the anti-chipping pattern extends in parallel with the scribe line.

6. The method of claim 1, further comprising:
cutting the semiconductor bridge pattern at a same time as cutting the cover.

7. The method of claim 1, wherein the semiconductor bridge pattern and the scribe line have substantially a same width.

8. The method of claim 1, further comprising:
before forming the via holes and before forming the scribe line, forming a mask pattern on the second surface of the semiconductor substrate, wherein the mask pattern includes a first area having a first thickness and a second area having a second thickness less than the first thickness;
wherein forming the via holes, the scribe line, and the semiconductor bridge pattern comprises forming the via holes, the scribe line, and the semiconductor bridge pattern using the mask pattern as an etch mask.

9. The method of claim 8, wherein the mask pattern includes first openings exposing portions of the first and second semiconductor chip areas corresponding to the via holes, and a second opening exposing a portion of the semiconductor substrate between the first and second semiconductor chip areas corresponding to the scribe line.

10. The method of claim 9, wherein the first and second areas of the mask pattern are formed before forming the semiconductor bridge pattern on portions of the semiconductor substrate corresponding to the semiconductor bridge pattern.

11. The method of claim 10, wherein the mask pattern comprises a first mask pattern, the method further comprising:
   after forming the semiconductor bridge pattern, forming a second mask pattern exposing a portion of the semiconductor bridge pattern by removing the second area of the first mask pattern.

12. The method of claim 11, further comprising:
   etching the semiconductor bridge pattern using the second mask pattern as an etching mask.

13. The method of claim 12, wherein etching the semiconductor bridge pattern comprises etching the semiconductor bridge pattern using the second mask pattern as an etching mask to provide a recess in the semiconductor bridge pattern opposite the cover.

14. A method of packaging a semiconductor device, the method comprising:
   providing a semiconductor substrate having first and second spaced apart semiconductor chip areas;
   adhering a cover on the first and second semiconductor chip areas of the semiconductor substrate;
   forming via holes through the semiconductor substrate in the first and second semiconductor chip areas;
   forming a scribe line between the first and second semiconductor chip areas while maintaining an anti-crack portion of the semiconductor substrate in the scribe line and while maintaining the cover across the first and second semiconductor chip areas and across the scribe line therebetween; and
   after forming the scribe line, cutting the cover along the scribe line.

15. The method of claim 14, wherein the anti-crack portion is connected to the first and second semiconductor chip areas.

16. The method of claim 14, further comprising;
   forming a recessed anti-chipping area in the anti-crack portion.

17. The method of claim 14, wherein the anti-crack portion and the cover are cut at a same time.

18. A method of packaging a semiconductor device, the method comprising:
   providing a semiconductor substrate including first and second spaced apart semiconductor chip areas;
   adhering a cover on the first and second spaced apart semiconductor chip areas of the semiconductor substrate;
   forming a scribe line through the semiconductor substrate between the first and second semiconductor chip areas wherein a semiconductor bridge pattern remains connected between the first and second spaced apart semiconductor chip areas after forming the scribe line, wherein the cover is maintained across the first and second semiconductor chip areas and across the scribe line therebetween after forming the scribe line, and wherein the scribe line comprises an opening through the semiconductor substrate; and
   after forming the scribe line, cutting the cover and the semiconductor bridge pattern.

19. A method according to claim 18 further comprising:
   before forming the scribe line, forming via holes through the semiconductor substrate in the first and second semiconductor chip areas.

20. A method according to claim 18 further comprising:
   before cutting the cover and the semiconductor bridge pattern, forming a recess in the semiconductor bridge pattern opposite the cover so that the semiconductor bridge pattern is between the recess and the cover, wherein the recess is aligned in a direction parallel with respect to the scribe line.

* * * * *